US006452848B1

United States Patent
Obremski et al.

(10) Patent No.: US 6,452,848 B1
(45) Date of Patent: Sep. 17, 2002

(54) PROGRAMMABLE BUILT-IN SELF TEST (BIST) DATA GENERATOR FOR SEMICONDUCTOR MEMORY DEVICES

(75) Inventors: Thomas E. Obremski, South Burlington; Jeffrey H. Dreibelbis, Williston; Peter O. Jakobsen, Milton, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/950,864

(22) Filed: Sep. 12, 2001

(51) Int. Cl.[7] .............................................. G11C 29/00
(52) U.S. Cl. ........................ 365/201; 365/240; 714/718
(58) Field of Search ................................ 365/201, 240, 365/189.12; 714/718, 733

(56) References Cited

U.S. PATENT DOCUMENTS

| | | |
|---|---|---|
| 5,173,906 A | 12/1992 | Dreibelbis et al. |
| 5,535,164 A | 7/1996 | Adams et al. |
| 5,844,914 A | 12/1998 | Kim et al. |
| 5,923,599 A | 7/1999 | Hii et al. |
| 5,946,246 A | 8/1999 | Jun et al. |
| 5,961,653 A | 10/1999 | Kalter et al. |
| 5,970,005 A * | 10/1999 | Yin et al. .................... 365/201 |
| 5,996,091 A * | 11/1999 | Jones et al. .................... 714/37 |
| 6,230,290 B1 | 5/2001 | Keidel et al. |

OTHER PUBLICATIONS

"Embedded DRAM Built In Self Test and Methodology for Test Insertion," Peter Jakobsen, Jeffrey Dreibelbis, Gary Pomichter, Darren Anand, John Barth, Michael Nelms, Jeffrey Leach, and George Belansek; Mar. 14, 2001, pp. 1–10.

"A 256Meg SDRAM BIST for Distrub Test Application," International Test Conf erence; Paper 9.1; Theo J. Powell, Francis Hii, and Dan Cline; 1997; pp. 200–208.

"Processor–Based Built–In Self–Test for Ebedded DRAM," IEEE Journal of Solid–State Circuits, vol. 33, No. 11, Nov. 1998; Jeffrey Dreibelbis, John Barth, Howard Kalter, and Rex Kho; pp. 1731–1740.

"Test and Diagnosis of Embedded Memory Using BIST," Evaluation Engineering, Ian Burgess; 2000; pp. 1–6.

"Built–In Self Test of DRAM Chips—An Overview of Issues and Papers," 1996; pp. 1–5.

* cited by examiner

Primary Examiner—Huan Hoang
(74) Attorney, Agent, or Firm—Cantor Colburn LLP; Robert Walsh

(57) ABSTRACT

A programmable data generator for generating input test data to be applied to a semiconductor memory array is disclosed. In an exemplary embodiment of the invention, the data generator includes a programmable address scramble register which has a plurality of storage locations associated therewith. The plurality of storage locations corresponds to array address bits associated with an address generator. A first exclusive OR (XOR) logic structure is coupled to the address generator and the address scramble register, wherein the first XOR logic structure generates an address-dependent, data scramble output signal that ultimately determines a data pattern to be applied to the memory array.

19 Claims, 4 Drawing Sheets

Checkerboard Data = Data Word (0000) ⊕ Row Addr 0 ⊕ Col Addr 0

|  | DATA WORD 0 | | | | DATA WORD 1 | | | | DATA WORD 2 | | | | DATA WORD 3 | | | |
|---|---|---|---|---|---|---|---|---|---|---|---|---|---|---|---|---|
|  | Col 0 | Col 1 | Col 2 | Col 3 | Col 0 | Col 1 | Col 2 | Col 3 | Col 0 | Col 1 | Col 2 | Col 3 | Col 0 | Col 1 | Col 2 | Col 3 |
| Row 0 | 0 | 1 | 0 | 1 | 0 | 1 | 0 | 1 | 0 | 1 | 0 | 1 | 0 | 1 | 0 | 1 |
| Row 1 | 1 | 0 | 1 | 0 | 1 | 0 | 1 | 0 | 1 | 0 | 1 | 0 | 1 | 0 | 1 | 0 |
| Row 2 | 0 | 1 | 0 | 1 | 0 | 1 | 0 | 1 | 0 | 1 | 0 | 1 | 0 | 1 | 0 | 1 |
| Row 3 | 1 | 0 | 1 | 0 | 1 | 0 | 1 | 0 | 1 | 0 | 1 | 0 | 1 | 0 | 1 | 0 |
| Row 4 | 0 | 1 | 0 | 1 | 0 | 1 | 0 | 1 | 0 | 1 | 0 | 1 | 0 | 1 | 0 | 1 |
| Row 5 | 1 | 0 | 1 | 0 | 1 | 0 | 1 | 0 | 1 | 0 | 1 | 0 | 1 | 0 | 1 | 0 |
| Row 6 | 0 | 1 | 0 | 1 | 0 | 1 | 0 | 1 | 0 | 1 | 0 | 1 | 0 | 1 | 0 | 1 |
| Row 7 | 1 | 0 | 1 | 0 | 1 | 0 | 1 | 0 | 1 | 0 | 1 | 0 | 1 | 0 | 1 | 0 |

FIG. 3a: Checkerboard data in a PDL oriented array

Checkerboard Data = Data Word (0101) ⊕ Row Addr 0

|  | COLUMN 0 | | | | COLUMN 1 | | | | COLUMN 2 | | | | COLUMN 3 | | | |
|---|---|---|---|---|---|---|---|---|---|---|---|---|---|---|---|---|
|  | Data 0 | Data 1 | Data 2 | Data 3 | Data 0 | Data 1 | Data 2 | Data 3 | Data 0 | Data 1 | Data 2 | Data 3 | Data 0 | Data 1 | Data 2 | Data 3 |
| Row 0 | 0 | 1 | 0 | 1 | 0 | 1 | 0 | 1 | 0 | 1 | 0 | 1 | 0 | 1 | 0 | 1 |
| Row 1 | 1 | 0 | 1 | 0 | 1 | 0 | 1 | 0 | 1 | 0 | 1 | 0 | 1 | 0 | 1 | 0 |
| Row 2 | 0 | 1 | 0 | 1 | 0 | 1 | 0 | 1 | 0 | 1 | 0 | 1 | 0 | 1 | 0 | 1 |
| Row 3 | 1 | 0 | 1 | 0 | 1 | 0 | 1 | 0 | 1 | 0 | 1 | 0 | 1 | 0 | 1 | 0 |
| Row 4 | 0 | 1 | 0 | 1 | 0 | 1 | 0 | 1 | 0 | 1 | 0 | 1 | 0 | 1 | 0 | 1 |
| Row 5 | 1 | 0 | 1 | 0 | 1 | 0 | 1 | 0 | 1 | 0 | 1 | 0 | 1 | 0 | 1 | 0 |
| Row 6 | 0 | 1 | 0 | 1 | 0 | 1 | 0 | 1 | 0 | 1 | 0 | 1 | 0 | 1 | 0 | 1 |
| Row 7 | 1 | 0 | 1 | 0 | 1 | 0 | 1 | 0 | 1 | 0 | 1 | 0 | 1 | 0 | 1 | 0 |

FIG. 3b: Checkerboard data in a dataword oriented array

Extended Chbd Data = Data Word (0101) ⊕ Row Addr 0 ⊕ Row Addr 1

|  | DATA WORD 0 | | | | DATA WORD 1 | | | | DATA WORD 2 | | | | DATA WORD 3 | | | |
|---|---|---|---|---|---|---|---|---|---|---|---|---|---|---|---|---|
|  | Col 0 | Col 1 | Col 2 | Col 3 | Col 0 | Col 1 | Col 2 | Col 3 | Col 0 | Col 1 | Col 2 | Col 3 | Col 0 | Col 1 | Col 2 | Col 3 |
| Row 0 | 0 | 0 | 0 | 0 | 1 | 1 | 1 | 1 | 0 | 0 | 0 | 0 | 1 | 1 | 1 | 1 |
| Row 1 | 1 | 1 | 1 | 1 | 0 | 0 | 0 | 0 | 1 | 1 | 1 | 1 | 0 | 0 | 0 | 0 |
| Row 2 | 1 | 1 | 1 | 1 | 0 | 0 | 0 | 0 | 1 | 1 | 1 | 1 | 0 | 0 | 0 | 0 |
| Row 3 | 0 | 0 | 0 | 0 | 1 | 1 | 1 | 1 | 0 | 0 | 0 | 0 | 1 | 1 | 1 | 1 |
| Row 4 | 0 | 0 | 0 | 0 | 1 | 1 | 1 | 1 | 0 | 0 | 0 | 0 | 1 | 1 | 1 | 1 |
| Row 5 | 1 | 1 | 1 | 1 | 0 | 0 | 0 | 0 | 1 | 1 | 1 | 1 | 0 | 0 | 0 | 0 |
| Row 6 | 1 | 1 | 1 | 1 | 0 | 0 | 0 | 0 | 1 | 1 | 1 | 1 | 0 | 0 | 0 | 0 |
| Row 7 | 0 | 0 | 0 | 0 | 1 | 1 | 1 | 1 | 0 | 0 | 0 | 0 | 1 | 1 | 1 | 1 |

FIG. 4a: Extended Chbd data in a PDL oriented array

Extended Chbd Data = Data Word (0000) ⊕ Row Addr 0 ⊕ Row Addr 1 ⊕ Col Addr 0

|  | COLUMN 0 | | | | COLUMN 1 | | | | COLUMN 2 | | | | COLUMN 3 | | | |
|---|---|---|---|---|---|---|---|---|---|---|---|---|---|---|---|---|
|  | Data 0 | Data 1 | Data 2 | Data 3 | Data 0 | Data 1 | Data 2 | Data 3 | Data 0 | Data 1 | Data 2 | Data 3 | Data 0 | Data 1 | Data 2 | Data 3 |
| Row 0 | 0 | 0 | 0 | 0 | 1 | 1 | 1 | 1 | 0 | 0 | 0 | 0 | 1 | 1 | 1 | 1 |
| Row 1 | 1 | 1 | 1 | 1 | 0 | 0 | 0 | 0 | 1 | 1 | 1 | 1 | 0 | 0 | 0 | 0 |
| Row 2 | 1 | 1 | 1 | 1 | 0 | 0 | 0 | 0 | 1 | 1 | 1 | 1 | 0 | 0 | 0 | 0 |
| Row 3 | 0 | 0 | 0 | 0 | 1 | 1 | 1 | 1 | 0 | 0 | 0 | 0 | 1 | 1 | 1 | 1 |
| Row 4 | 0 | 0 | 0 | 0 | 1 | 1 | 1 | 1 | 0 | 0 | 0 | 0 | 1 | 1 | 1 | 1 |
| Row 5 | 1 | 1 | 1 | 1 | 0 | 0 | 0 | 0 | 1 | 1 | 1 | 1 | 0 | 0 | 0 | 0 |
| Row 6 | 1 | 1 | 1 | 1 | 0 | 0 | 0 | 0 | 1 | 1 | 1 | 1 | 0 | 0 | 0 | 0 |
| Row 7 | 0 | 0 | 0 | 0 | 1 | 1 | 1 | 1 | 0 | 0 | 0 | 0 | 1 | 1 | 1 | 1 |

FIG. 4b: Extended Chbd data in a dataword oriented array

PROGRAMMABLE BUILT-IN SELF TEST (BIST) DATA GENERATOR FOR SEMICONDUCTOR MEMORY DEVICES

BACKGROUND

The present invention relates generally to integrated circuit memory devices and, more particularly, to an apparatus and method for generating desired data test patterns for RAM BIST devices.

As Application Specific Integrated Circuit (ASIC) technologies expand into new markets, the need for denser embedded memory increases. For example, markets in portable and multimedia applications such as cellular phones and personal digital assistants demand increased density of embedded memory for higher function and lower power consumption. In order to accommodate this increased demand, embedded DRAM (eDRAM) macros have been offered in state-of-the-art ASIC portfolios. The integration of eDRAM into ASIC designs has intensified the focus on how best to test a high-density macro, as complex as DRAM, in a logic test environment. The traditional use of Direct Memory Access (DMA) testing, however, proves to be costly in terms of silicon area, available I/O pins, wiring complexity and test time.

Accordingly, a more attractive solution to the embedded-device logic test problem has been through the use of a Built-In Self Test (BIST) system that is adapted to provide all of the elements sufficient to provide high-fault coverage on DRAM. Such elements include, for example, the calculation of a two-dimensional redundancy solution, pattern programming flexibility, at-speed testing, and test mode application for margin testing. The development of BIST capabilities has allowed the testing of large, embedded memories on logic testers without added die area or performance testing inaccuracies associated with isolation multiplexers.

One potential drawback associated with existing BIST systems stems from the fact that the desired data test patterns to be applied to memory array are typically pre-programmed or fixed at the time of the BIST design. Thus, in the event that new data patterns or a greater number of simple data patterns are desired, commands already defined and hard-coded into a microprogram (ROM) within the BIST architecture are then required to be reprogrammed. However, such reprogramming also increases the time and cost involved in memory test applications. Furthermore, for more complex data types, it may be necessary to redesign the BIST itself. This process is even more lengthy as it involves replacement of a portion of the BIST design, resulting in verification of the new design as well as multiple, new production masks.

BRIEF SUMMARY

The above discussed and other drawbacks and deficiencies of the prior art are overcome or alleviated by a programmable data generator for generating input test data to be applied to a semiconductor memory array. In an exemplary embodiment of the invention, the data generator includes a programmable address scramble register which has a plurality of storage locations associated therewith. The plurality of storage locations corresponds to array address bits associated with an address generator. A first exclusive OR (XOR) logic structure is coupled to the address generator and the address scramble register, wherein the first XOR logic structure generates an address-dependent, data scramble output signal that ultimately determines a data pattern to be applied to the memory array.

In a preferred embodiment, the address-dependent, data scramble output signal is a function of a pre-selected set of the array address bits, wherein the pre-selected array address bits are selected by the values of a series of programmed data bits contained in the address scramble register. In addition, a data word register has a plurality of storage locations associated therewith for containing a programmed data word therein. The data word comprises a portion of the data pattern to be applied to the memory array. A second XOR logic structure has data bits from the data word, along with the address-dependent, data scramble output signal as inputs thereto. The second XOR logic structure thereby generates the data pattern to be applied to the memory array.

Preferably, the first XOR logic structure includes a plurality of AND gates, with each of the plurality of AND gates having one of the data bits in said address scramble register as a first input thereto, and one of the array address bits as a second input thereto. The first XOR logic structure further includes an XOR gate which has as inputs thereto the outputs of the plurality of AND gates, and a data polarity signal. The data polarity signal is indicative of a desired pattern data polarity. Furthermore, the second XOR logic structure preferably includes a plurality of XOR gates, with each of the plurality of XOR gates further having one of the data bits from the data word as a first input thereto, and the address-dependent, data scramble output signal as a second input thereto.

BRIEF DESCRIPTION OF THE DRAWINGS

Referring to the exemplary drawings wherein like elements are numbered alike in the several Figures:

FIGS. 3(a), 3(b), 4(a) and 4(b) are tables illustrating various examples of data patterns which may be generated by specific programming of the BIST data generator.

DETAILED DESCRIPTION

As will be understood from the following description, a programmable data generator has been developed which enables an embedded DRAM BIST system to allow for the generation of data types applied to changing defect densities and test requirements. This data generation technique builds on the address-based symmetry of the data types to provide a means for generating the resulting data patterns without the need for implementing each in hardware. A novel data generation apparatus and method is achieved through the use of, among other aspects, exclusive-OR (XOR) logic. By expanding an XOR logic technique to include any subset of the address bits associated with a memory array, a flexible data generation scheme is developed that allows these data types to be changed over time.

Figure 1:
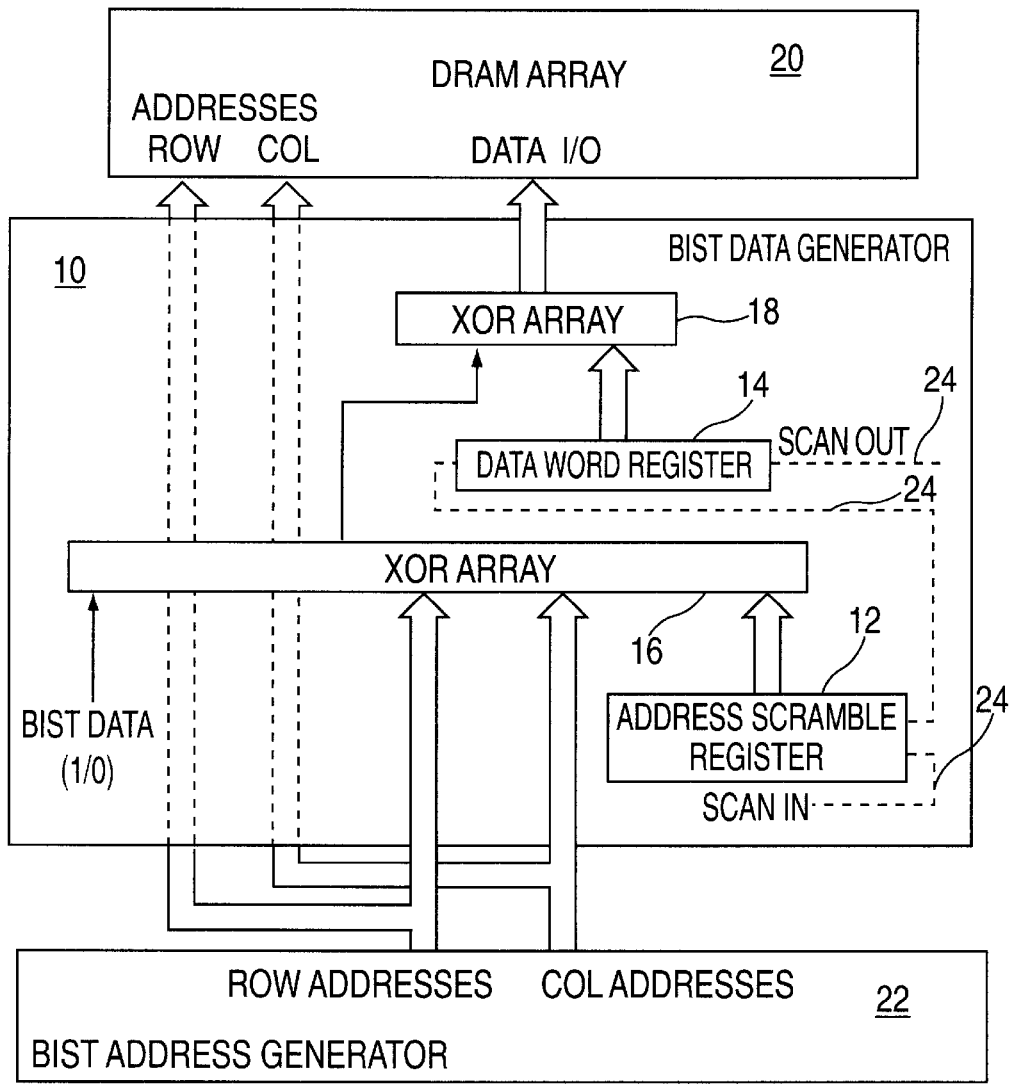
FIG. 1 is a high-level block diagram illustrating a programmable BIST data generator, in accordance with an embodiment of the invention.

Referring initially to FIG. 1, there is shown a highlevel block diagram which illustrates a programmable BIST data generator 10, in accordance with an embodiment of the invention. Data generator 10 includes an address scramble register 12, a data word register 14, a first exclusive or (XOR) logic structure 16 and a second XOR logic structure 18. The output of second XOR logic structure 18 represents the actual test data applied to the DRAM array 20 under test. A BIST address generator 22 determines the particular array addresses to be tested (i.e., array addresses to be written to or read from during a test), which addresses may include either the entire set of addresses in DRAM array 20 or alternatively, a subset thereof. In addition, the addresses generated by address generator 22 are also inputted into (and used by) BIST data generator 10, since the resulting data pattern is a function of the array address.

Both the address scramble register 12 and data word register 14 are programmable. The programmed contents of the scramble register 12 are inputted to first XOR logic structure 16, while the programmed contents of the data word register 14 are inputted to second XOR logic structure 18. In a preferred embodiment, both the address scramble register 12 and data word register 14 are further incorporated into a scan chain 24 so that a desired data scramble may be programmed independently for each test pattern. However, a parallel-type of data input structure may also be used.

Figure 2:
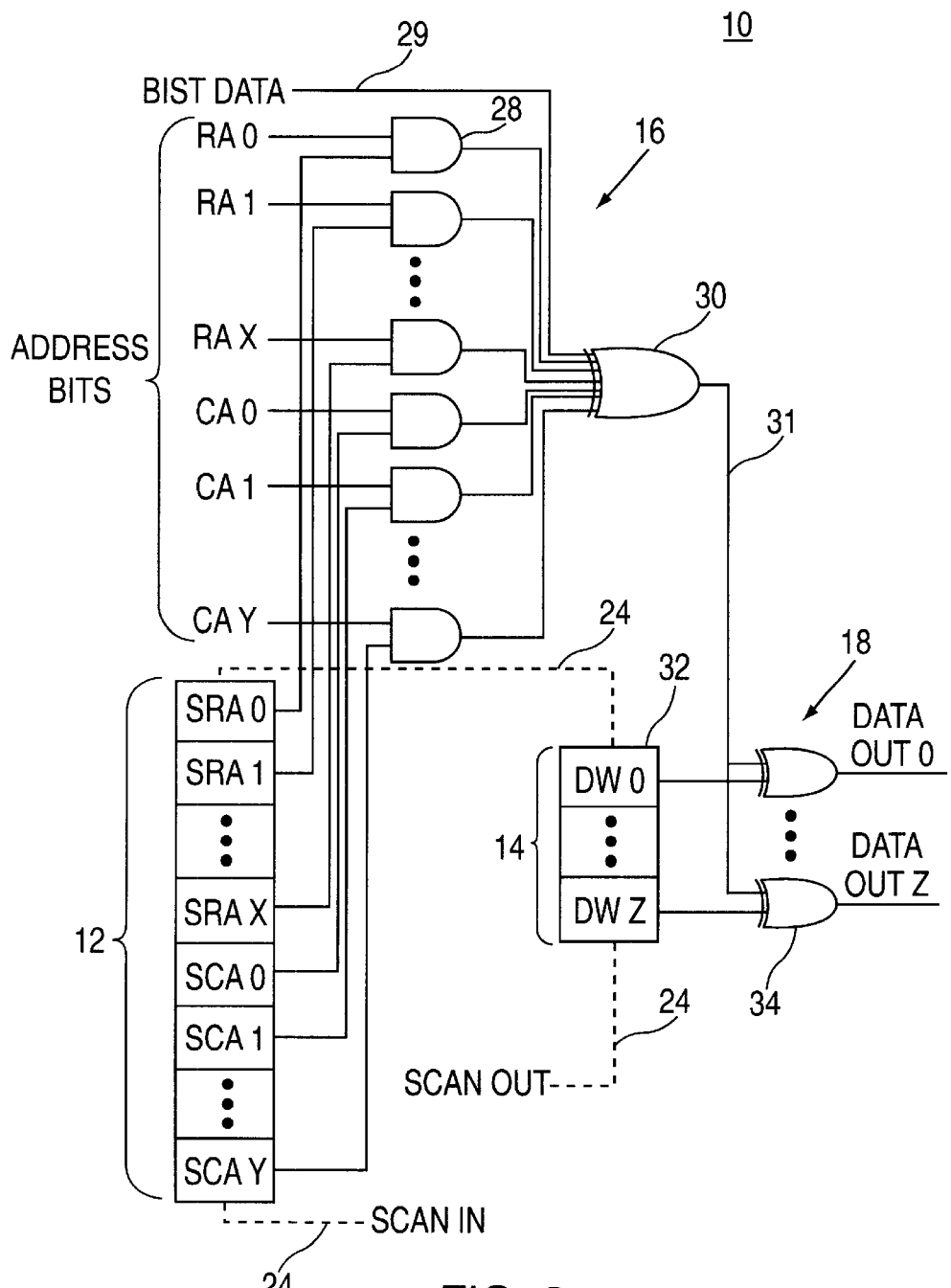
FIG. 2 is a schematic diagram of the data generator shown in FIG. 1, illustrating logic components therein used generate a test data pattern.

Referring now to the schematic diagram of FIG. 2, the interaction of devices within data generator 10 is shown in greater detail. As can be seen, the address scramble register 12 contains a plurality of storage locations 26 (individually designated SRA 0 through SRA X, and SCA 0 through SCA Y) which correspond to the total number of address bits used to decode the row and column addresses of the array 20. By way of a simplified example, in a 64-cell memory array having eight rows and columns, there would be a total of 6 address bits associated with BIST address generator 22 (3 bits for each of the row and column addresses), and therefore a total of six storage locations in the address scramble register 12. Again, the data values contained in the storage locations of address scramble register 12 are programmed therein by scanbased techniques.

The programmed data bits contained in each storage location 26 of address scramble register 12 are inputted, along with a corresponding address bit from BIST address generator 22, into a series of AND gates 28 located within first XOR logic structure 16. Thus, the programmed data bit in SRA 0 is paired with the address bit RA 0 into a first AND gate, the programmed data bit in SRA 1 is paired with the address bit RA 1 into a second AND gate, and so forth. Then, the outputs of each AND gate 28, along with a BIST data signal 29, are inputted to a multi-input XOR gate 30. As will be explained in greater detail hereinafter, the output signal 31 of XOR gate 30 represents an address-dependent data scramble that, based upon the specific array address, determines the content of the test data applicable for that address.

Similar to the address scramble register 12, the data word register 14 has a plurality of storage locations 32 associated therewith (designated DW 0 through DW Z), which correspond to the number of bits in a data word (or data words) to be inputted to each selected array address. Each bit (programmed through scan chain 24) in data word register 14 is further inputted into a corresponding two-input XOR gate 34, included in second XOR logic structure 18. The second input for each of the XOR gates 34 is the output signal 31 of XOR gate 30, which signal fanned out thereto. Finally, the outputs (designated Data Out 0 through Data Out Z) of the XOR gates 34 are the bits comprising the test data word(s) to be written to (or compared with the data stored in) the DRAM array 20.

Although the data word register 14 is embodied in the Figures as being equivalent in size as the test data word to be applied to the DRAM array 20 (i.e., one storage latch for each bit in the test data word), this need not necessarily be the case. In certain applications, embedded DRAM arrays may be tested with word sizes as large as 256 or 292 bits. It may be that a corresponding data word register of such length would be too large for design purposes. A possible alternative, therefore, would be to use a smaller data word register with fanned out data bits to create the larger data word used by the array. For example, if data word register 14 were to be 8 bits in length, then each output of XOR gates 34 would be fanned out 32 times to create a 256 bit test word. Obviously, such an alternative results in a "data topology trade off" to a certain extent, because the individual test bits would have a dependency on the 8 base bits stored in data word register 14.

The operation of data generator 10 may now be understood by referring once again to address scramble register 12. Depending upon the particular values stored therein, certain address locations may be selectively excluded from playing a role in the topology of the generated data type. More specifically, any address bits that are paired with scramble values of "1" from address scramble register 12 will propagate through the respective AND gate 28. The remaining address bits, having "0" values stored in their corresponding address scramble register locations, will not participate in the exclusive-OR function, since the output of any AND gate having at least one "0" input is "0". Accordingly, these remaining address bits will not play a role in the topology of the generated data type. This stems from the fact that the output of an XOR gate depends upon the number (even or odd) of "1" bits inputted thereto. Thus, any "0" input to an XOR gate, by itself, has no direct bearing upon the output thereof.

As an illustrative example, it will be assumed that for a given test sequence, a "1" is programmed into storage location SRA 0 of address scramble register 12, and a "0" is programmed into all other storage locations. In this configuration then, only row address bit RA 0 will have an effect on the generated data pattern. Since all of the bits stored in address scramble register locations SRA 1 through SRA X and SC 0 through SCA Y are "0", the output of every AND gate 28 (except for the one coupled to RA 0) is always "0". On the other hand, the output of AND gate 28 coupled to RA 0 and SRA 0 follows the value of RA 0. The resulting address-dependent data scramble value (i.e., the value of output signal 31) then becomes an odd-function of address bit RA 0 and BIST data signal 29. The value of BIST data signal 29 controls the desired pattern data polarity (e.g., pass the data word or invert the data word).

Depending upon the value of output signal 31, the second XOR logic structure 18 will either pass the data word stored in data word register 14 or invert it. If output signal 31 of XOR gate 30 is "0", then each XOR gate 34 will pass the value of the bit stored in the corresponding storage location in data word register 14. However, if output signal 31 is "1", then the XOR gates 34 will invert the bits stored in data word register 14.

For example, it will be assumed that the data word register 14 is a 4-bit register having storage locations DW 0, DW1, DW2 and DW 3, wherein a programmed test data word consists of the bits "0101". Combining this data word example with the above example (where: SRA 0="1", all other address scramble register bits="0", and BIST data signal="0"), it will be seen that the value of output signal 31 equals the value of address bit RA 0. Thus, whenever RA 0="0", then output signal 31="0". As a result, the data word "0101" is applied (e.g., written to) every generated address which corresponds to the RA 0 bit equaling "0". However, when address bit RA 0="1", the output of XOR gate 30 becomes "1". This means that second XOR logic structure 34 will invert the data word from "0101" to "1010", and apply it to every address corresponding to address bit where RA 0 equals "1".

In the above simplified example, the output of data generator 10 is a function of the generated array address, the BIST data signal 29, and the value of the data contained in data word register 14. More specifically, due to the programmed input of address scramble register 12, the resulting data output is particularly a function of address bit RA 0. However, the output may be made dependent upon any combination of address bits by simply programming the corresponding storage location of address scramble register 12 with a "1" therein.

It should also be noted at this point that in the embodiment depicted, DRAM array 20 is capable of storing a data word(s) at each address therein that may be several bits in length (e.g., a 256 bit word). However, the principles of the present invention are equally applicable to a memory device that stores just a single data bit at each array address. In such a case, neither data word register 14 nor second XOR logic structure 18 need be used, since the output of first XOR logic structure 16 would then represent the actual, single test bit generated for a given address.

Finally, FIGS. 3(*a*), 3(*b*), 4(*a*) and 4(*b*) illustrate various possible data patterns which may be generated through the use of data generator 10. In addition, these exemplary data patterns are applied to two types of DRAM array architectures. The first architecture, referred to as a data line-oriented DRAM, is organized such that the column addresses associated with a single bit of the data word are grouped together in the column dimension of the array. This architecture is commonly used in DRAM arrays to allow the decoding of the column addresses to be performed at the sense amplifiers, so that one data bit can be selected from the various column addresses and driven to the DRAM interface via a single data line. While this type of architecture allows the column decoding to occur at the sense amplifier level, it results in data word bits that are physically separated from each other in the array by the total number of column addresses. The second DRAM architecture, referred to as data word-oriented DRAM, writes the data word in adjacent array cells while the column addresses are separated from each other by the width of each data word. This architecture can be found in DRAM arrays where the column decoding occurs closer to the DRAM interface. Since either DRAM architecture may be used in an embedded application, the capabilities of programmable data generator 10 are demonstrated for both.

In FIG. 3(*a*), the checkerboard data pattern of alternating 0's and 1's is generated by data generator 10 for-a data line-oriented array using a 4 -bit data word of "0000", wherein the data output is a function of address bits RA 0 and CA 0. Again, this pattern is implemented by programming storage locations SRA 0 and SCA 0 in address scramble register 12 with "1", and all other storage locations with "0". FIG. 3(*b*) illustrates the same checkerboard pattern generated for a data word-oriented array. In this case, the pattern is generated with a 4-bit data word of "0101", with the output being a function of address bit RA 0.

FIGS. 4(*a*) and 4(*b*) illustrate another type of checkerboard data pattern. Instead of having alternating 1's and 0's in adjacent array cells, this checkerboard pattern is characterized by alternating "blocks" of 1's and 0's, wherein the blocks are either a row of four identical bits, or two rows of four identical bits. For a data line-oriented array (FIG. 4(*a*)), this pattern is generated with a 4-bit data word of "0101", along with the exclusive OR function of address bits RA 0 and RA 1. For the data word-oriented array, the pattern is generated with data word "0000", along with the XOR function of address bits RA 0, RA 1 and CA 0, as shown in FIG. 4(*b*).

From the foregoing description, it will be appreciated that a programmable data generator has been developed which enables an embedded DRAM BIST to adapt to data types applied to changing defect densities and test requirements. The above described data generation methods build upon the address-based symmetry of these data types to provide a means for generating the required data backgrounds without the need for implementing each in hardware. Although existing data generation architectures (based on the selection of a predefined data type) may suffice for the testing of SRAM arrays, such architectures are limited in their ability to be adapted to new DRAM array sensitivities. In contrast, the foregoing programmable data generation architecture allows a data type to be determined and loaded into the BIST at the start of each test. This architecture is based on the development of a novel data generation technique, including the ability to generate both simple and complex data types (e.g., checkerboard, column stripe, row stripe, etc.) as an exclusive OR function of a subset of the address bits. The flexibility of the programmable data generator provides a embedded DRAM test developer with many options for using complex array data types to efficiently test for data sensitive defect mechanisms.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for generating input test data to be applied to a semiconductor memory array, the array having a plurality of row and column address storage locations associated therewith, the method comprising:

programming an address scramble register with a series of data bits, said address scramble register having a number of storage locations corresponding to a number of address bits associated with an address generator; and inputting said series of programmed data bits contained in said address scramble register, along with a generated array address, into a first exclusive OR (XOR) logic structure;

wherein said first XOR logic structure generates an address-dependent, data scramble output signal that determines a data pattern to be applied to the memory array.

2. The method of claim 1, wherein said generated array address has a plurality of address bits associated therewith, said plurality of address bits corresponding to said number of storage locations in said address scramble register.

3. The method of claim 1, wherein said address-dependent, data scramble output signal is a function of a pre-selected set of address bits in said generated array address.

4. The method of claim 3, wherein said pre-selected address bits are selected by the values of said series of programmed data bits contained in said address scramble register.

5. The method of claim 4, wherein said pre-selected address bits are selected by programming a logic "1" data bit into a corresponding location in said address scramble register.

6. The method of claim 1, further comprising:
   programming a data word register with a data word therein, said data word register having a plurality of storage locations associated therewith, and said data word comprising a portion of said data pattern to be applied to the memory array; and
   inputting data bits from said data word, along with said address-dependent, data scramble output signal, into a second XOR logic structure;
   wherein said second XOR logic structure generates said data pattern to be applied to the memory array.

7. The method of claim 6, wherein said first XOR logic structure comprises:
   a plurality of AND gates, each of said plurality of AND gates having:
      one of said data bits in said address scramble register as a first input thereto, and
      one of said address bits as a second input thereto; and
   an XOR gate, said XOR gate having as inputs thereto:
      outputs of said plurality of AND gates, and
      a data polarity signal, said data polarity signal indicative of a desired pattern data polarity.

8. The method of claim 7, wherein said second XOR logic structure further comprises a plurality of XOR gates, each of said plurality of XOR gates further having:
   one of said data bits from said data word as a first input thereto; and
   said address-dependent, data scramble output signal as a second input thereto.

9. The method of claim 6, wherein said address scramble register and said data word register are programmed through a scan chain.

10. The method of claim 6, wherein:
    based upon the value of said address-dependent, data scramble output signal, said second XOR logic structure either passes said data word for application to the memory array or inverts said data word for application to the memory array.

11. A programmable data generator for generating input test data to be applied to a semiconductor memory array, comprising:
    a programmable address scramble register, said address scramble register having a plurality of storage locations associated therewith, said plurality of storage locations in said programmable address scramble register corresponding to array address bits associated with an address generator; and
    a first exclusive OR (XOR) logic structure, coupled to said address generator and said address scramble register;
    wherein said first XOR logic structure generates an address-dependent, data scramble output signal that determines a data pattern to be applied to the memory array.

12. The programmable data generator of claim 11, wherein said addressdependent, data scramble output signal is a function of a pre-selected set of said array address bits.

13. The programmable data generator of claim 12, wherein said pre-selected array address bits are selected by the values of a series of programmed data bits contained in said address scramble register.

14. The programmable data generator of claim 13, wherein said pre-selected array address bits are selected by programming a logic "1" data bit into a corresponding location in said address scramble register.

15. The programmable data generator of claim 11, further comprising:
    a data word register, said data word register having a plurality of storage locations associated therewith for containing a programmed data word therein, said data word comprising a portion of said data pattern to be applied to the memory array; and
    a second XOR logic structure, said second XOR logic structure having data bits from said data word, along with said address-dependent, data scramble output signal, as inputs thereto;
    wherein said second XOR logic structure generates said data pattern to be applied to the memory array.

16. The programmable data generator of claim 15, wherein said first XOR logic structure comprises:
    a plurality of AND gates, each of said plurality of AND gates having:
       one of said data bits in said address scramble register as a first input thereto, and
       one of said array address bits as a second input thereto; and
    an XOR gate, said XOR gate having as inputs thereto:
       outputs of said plurality of AND gates, and
       a data polarity signal, said data polarity signal indicative of a desired pattern data polarity.

17. The programmable data generator of claim 16, wherein said second XOR logic structure further comprises a plurality of XOR gates, each of said plurality of XOR gates further having:
    one of said data bits from said data word as a first input thereto; and
    said address-dependent, data scramble output signal as a second input thereto.

18. The programmable data generator of claim 15, wherein said address scramble register and said data word register are programmed through a scan chain.

19. The programmable data generator of claim 15, wherein:
    based upon the value of said address-dependent, data scramble output signal, said second XOR logic structure either passes said data word for application to the memory array or inverts said data word for application to the memory array.

* * * * *